United States Patent [19]
McFarlane et al.

[11] Patent Number: 5,355,015
[45] Date of Patent: Oct. 11, 1994

[54] HIGH BREAKDOWN LATERAL PNP TRANSISTOR

[75] Inventors: Brian McFarlane, Campbell; Frank Marazita; John E. Readdie, both of San Jose, all of Calif.

[73] Assignee: National Semiconductor Corporation, Santa Clara, Calif.

[21] Appl. No.: 799,847

[22] Filed: Nov. 27, 1991

Related U.S. Application Data

[63] Continuation of Ser. No. 627,127, Dec. 13, 1990, abandoned.

[51] Int. Cl.$^5$ .................. H01L 29/72; H01L 27/02; H01L 27/04
[52] U.S. Cl. .................. 257/554; 257/552; 257/556; 257/557; 257/558; 257/563; 257/565; 257/575; 257/576
[58] Field of Search .................. 357/35, 34; 257/552, 257/554, 556, 557, 558, 563, 565, 575, 576

[56] References Cited

U.S. PATENT DOCUMENTS

| | | | |
|---|---|---|---|
| 3,667,008 | 5/1972 | Katnack | 317/235 R |
| 4,998,155 | 3/1991 | Watanabe et al. | 357/35 |
| 5,001,533 | 3/1991 | Yamaguchi | 357/35 |
| 5,014,107 | 5/1991 | Vera | 357/44 |
| 5,027,184 | 6/1991 | Soclof | 357/49 |

FOREIGN PATENT DOCUMENTS

| | | | |
|---|---|---|---|
| 316988 | 5/1989 | European Pat. Off. | 357/35 |
| 361589 | 4/1990 | European Pat. Off. | 357/35 |
| 0161667 | 8/1985 | Japan . | |
| 0196971 | 10/1985 | Japan . | |
| 0082560 | 3/1989 | Japan . | |
| 0110771 | 4/1989 | Japan . | |

OTHER PUBLICATIONS

Bhattacharyya et al., "Dual Base Lateral Bipolar Transistor", IBM Technical Disclosure Bulletin, vol. 20 No. 4, Sep. 1977.
Wieder, "Processing for a Lateral PNP Transistor in the Submicron Range", IBM Technical Disclosure Bulletin, vol. 21 No. 10, Mar. 1979.
IBM Corp. Technical Disclosure Bulletin, "Enclosed Lateral PNP Transistor", vol. 29 No. 3, Aug. 1986.

*Primary Examiner*—Andrew J. James
*Assistant Examiner*—Valencia M. Martin
*Attorney, Agent, or Firm*—Townsend and Townsend Khouri and Crew

[57] ABSTRACT

A lateral pnp transistor for use in programmable logic arrays. The lateral pnp has a layer of oxide disposed between a polysilicon layer and the base along the base width. The oxide layer prevents diffusion of the N+ dopant contained in the polysilicon layer into the N− base region. The base region thus remains N− and the resulting transistor has improved breakdown voltage characteristics while retaining the speed advantages of polysilicon contact layers. The lateral pnp transistor is manufactured by a method which requires minimal deviation from other methods used to manufacture lateral pnp transistors.

7 Claims, 7 Drawing Sheets

FIG. 13

| DEVICE | BREAKDOWN VOLTAGE CEO (V) | BETA @ 250 μA |
|---|---|---|
| PRESENT INVENTION (350A OXIDE UNDERPOLY) | 14 | 1.0 |
| N+ POLY WITH SILICIDE | 6 | 0.7 |
| N+ POLY WITH NO SILICIDE | 7.5 | 0.55 |
| INTRINSIC, UNDOPED POLY | 20 | 0.15 |

HIGH BREAKDOWN LATERAL PNP TRANSISTOR

This is a continuation of application Ser. No. 07/627,127, filed Dec. 13, 1990, now abandoned.

BACKGROUND OF THE INVENTION

The use of a polysilicon layer for local interconnect has been reported in the literature for both bipolar and metal oxide semiconductor (MOS) technologies. In bipolar processes, a polysilicon layer can be used to electrically contact the base and collector and as a diffusion source to form the emitter regions of bipolar transistors. In MOS technologies, a polysilicon layer can be used to electrically contact the source-drain regions of the MOS transistors and form the gates of MOS transistors. Global interconnects can be formed by contacting the polysilicon layer using conventional metal interconnects.

Lateral pnp transistors made with standard processes frequently have an N+ polysilicon layer in contact with the N− epitaxial base of the transistor. The N type dopant contained in the N+ polysilicon layer diffuses into the N− epitaxial base altering the properties of the base. As a result, junction breakdown voltages of the transistor occur at approximately six volts.

In programmable array logic circuits, high voltages are applied to the programming pins during programming of the circuits. This programming event requires transistor breakdown voltages in excess of twelve volts for transistor-transistor logic circuits (TTL) and in excess of nine volts for emitter coupled logic (ECL) circuits. For this reason, lateral pnp transistors fabricated with polysilicon layers using the conventional processes and having breakdown voltages of the order of six volts are not suitable for use in programmable array logic circuits.

Fabricating the lateral pnp transistor with undoped, or intrinsic, polysilicide material would prevent the diffusion problem and improve breakdown voltages. Such a transistor, however, has poor current gain characteristics and therefore lacks the speed advantages obtainable from devices using doped polysilicon materials.

SUMMARY OF THE INVENTION

The present invention relates generally to integrated circuits and their fabrication, and in particular to a device with improved breakdown voltage characteristics and speed for use in programmable array logic circuits.

According to one aspect of the invention, a device is disclosed in which an oxide layer is deposited between the N− epitaxial base of the lateral pnp transistor and the polysilicon layer along the base width. This oxide layer prevents diffusion of the N type dopant into the base region. The base thus remains N− and improvements in breakdown voltage characteristics result without relinquishing the speed advantages of utilizing doped polysilicon material. The higher breakdown voltages of the inventive devices also improve the production line yield rate.

According to another aspect of the invention, a method for manufacturing a lateral pnp transistor having an oxide layer located between the N− base of the transistor and the polysilicon layer is disclosed. This method of manufacture has the advantage of requiring minimal deviation from other processes used to manufacture the lateral pnp transistors. Extant manufacturing procedures can be implemented without deviation until a given point in the process when a module of steps necessary to carry out the present invention are performed. Once this module of steps is completed, the fabrication process can proceed as before. Thus, the method of the present invention does not require that integrated circuit manufacturers make costly changes to existing chip manufacturing procedures or that manufacturers implement an entirely new manufacturing sequence. As a result, the device improvements taught by the present invention may be had at a marginal cost over present devices.

According to yet another aspect of the present invention, a PMOS device is created using the manufacturing process of the present invention. The PMOS device can be fabricated using a bipolar process without any additional steps required. This feature of the present invention provides the circuit manufacturer with improved production flexibility since both PMOS and bipolar devices may be manufactured as desired from the same core manufacturing process.

BRIEF DESCRIPTION OF THE DRAWINGS

FIG. 13 is a comparison of performance characteristics for a semiconductor device fabricated according to the present invention with other semiconductor devices.

DETAILED DESCRIPTION OF THE INVENTION

The description which follows is directed to one particular embodiment of the present invention suitable for fabricating a lateral pnp bipolar transistor. It should be understood, however, that the present invention is not limited thereto and may be employed in any semiconductor process in which an oxide separator is desired between a doped polysilicon gate and an active layer of the silicon substrate.

Figure 1:
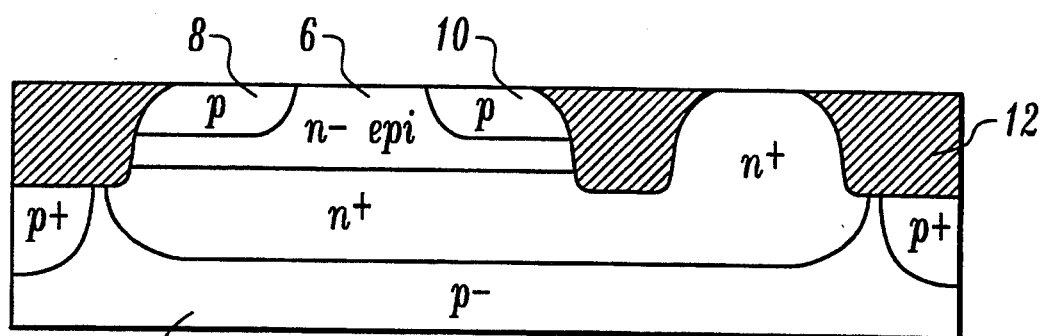
FIG. 1 is a cross-sectional view of a semiconductor substrate processed using conventional technology.

FIG. 1 shows a cross sectional view of a silicon substrate 2 having undergone preliminary processing according to conventional methods. Silicon substrate 2 is composed of a P type material. In this figure, silicon substrate 2 has been processed to form a N+ buried layer 4. N+ buried layer 4 may be formed, for example, by the process disclosed in U.S. Pat. No. 3,648,125 to Douglas L. Peltzer. An N− epitaxial layer 6 having a thickness 1.4μ is grown on the substrate and of an appropriate N type impurity, such as phosphorus, is introduced according to well known technologies. The impurity concentration in the N type layer is $1 \times 10^{16}$ atoms/cm$^3$. Epitaxial layer 6 will form the base of the lateral pnp transistor. P regions 8 and 10 are formed by diffusion of a P type dopant, such as aluminum. At this stage in the fabrication process, P regions 8 and 10 have a concentration density of $2 \times 10^{17}$ atoms/cm$^3$. P region 8 will form the collector of the lateral pnp transistor and P region 10 will form the emitter of the lateral pnp transistor at the completion of the fabrication process. Oxide regions 12a–c encircle the active regions to provide isolation between devices. The oxide regions are formed by methods well known to those skilled in the art.

Figure 2:
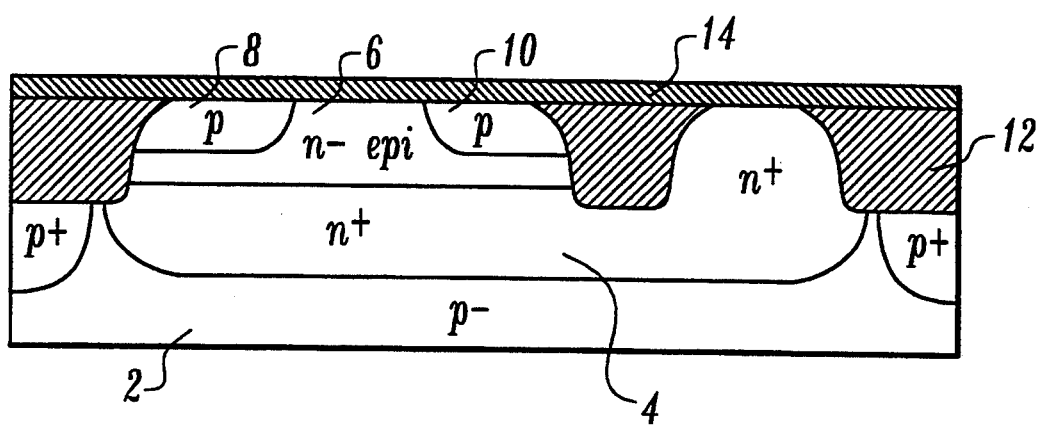
FIG. 2 is a cross-sectional view of a semiconductor substrate over which an oxide layer is grown according to an embodiment of the present invention.

In FIG. 2 a thin oxide layer 14 is shown on the surface of substrate 2. Oxide layer 14 is thermally grown by placing substrate 2 in an oxygen environment at a temperature of 900° C. for a period of 60 minutes. Oxide layer 14 has a thickness of about 350 Å.

Figure 3:
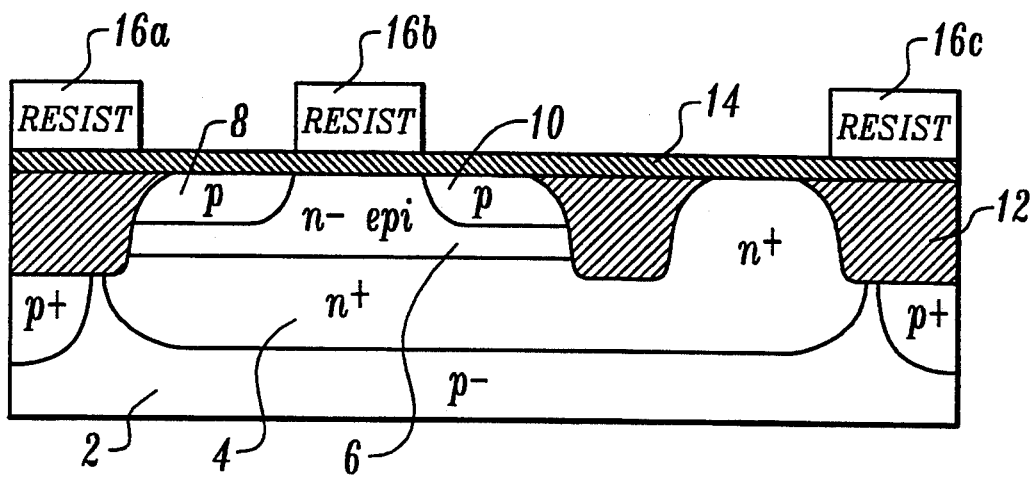
FIG. 3 is a cross-sectional view of a semiconductor substrate with PNP base mask prior to oxide etch according to an embodiment of the present invention.
Figure 4:
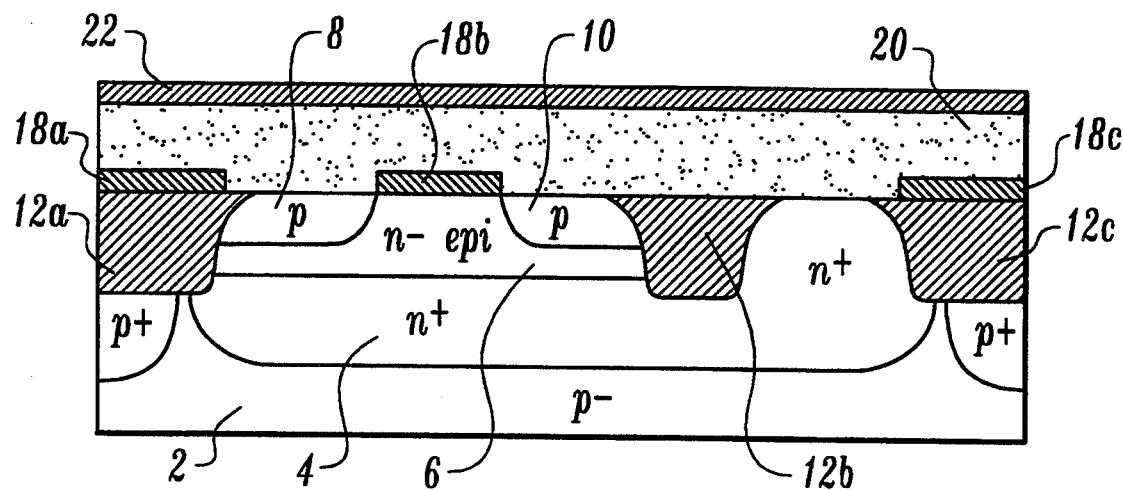
FIG. 4 is a cross-sectional view of a semiconductor substrate to which a polysilicon layer is deposited according to an embodiment of the present invention.
Figure 5:
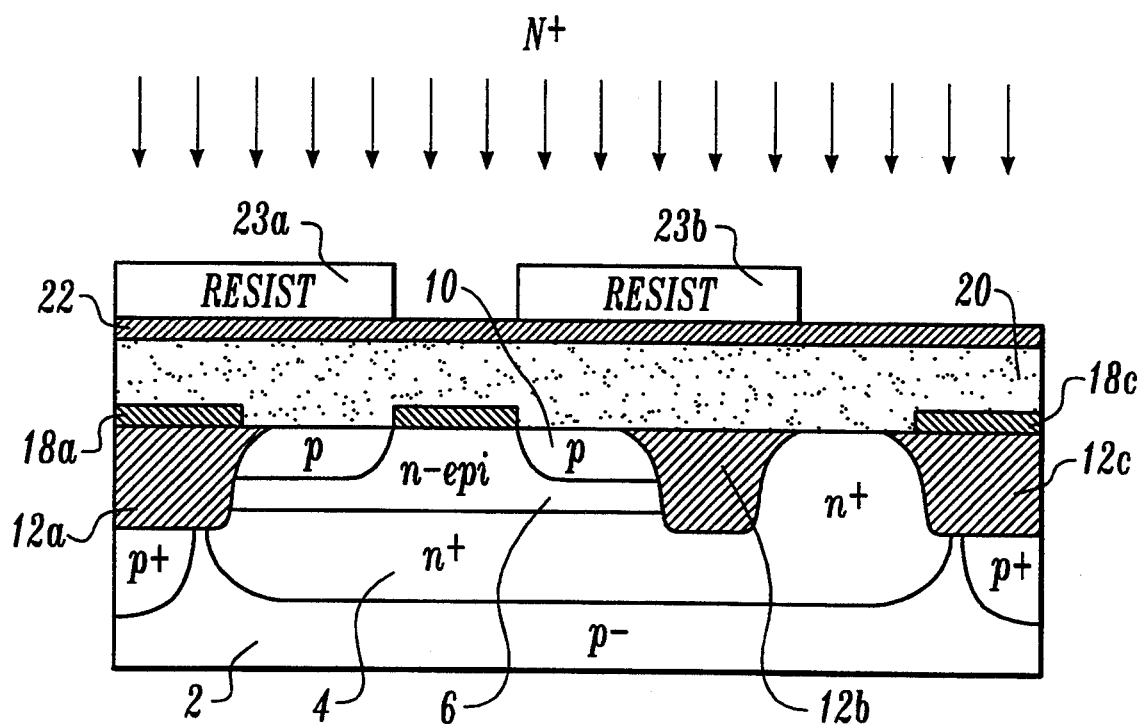
FIG. 5 is a cross-sectional view of a semiconductor substrate of FIG. 4 to which an implantation mask is applied according to an embodiment of the present invention.

After growth of oxide layer 14 a layer of photoresist material is applied and patterned over oxide layer 14 using methods well known in the art. Upon completion of this process, a controlled pattern of photoresist results as shown by 16a–c of FIG. 3. The controlled pattern of photoresist permits oxide layer 14 to be etched away only at those locations not covered by photoresist. After etch of the exposed portions of oxide layer 14 has been accomplished, photoresist 16a–c is removed. An oxide layer 18a–c remains on the surface of substrate 2 as shown in FIG. 4. Note that oxide layer 18b covers the surface area of region 6.

A layer of intrinsic polysilicon 20 is then deposited on the surface of substrate 2 and an oxide layer 22 grown on top of the polysilicon. See FIG. 3. Polysilicon layer 20 is deposited using chemical vapor deposition techniques well known in the art and has a thickness of 4250 Å.

A blanket implant of P material is then made. Although this step is not required to effect the present invention, a blanket implant would typically be a part of fabrication processes which create resistive devices elsewhere on the substrate. For this reason, the blanket implant retained as a process step. An additional benefit of retaining this step is that the processes which contain this step can incorporate the present invention with minimal deviation from the core process. However, this step is optional and can be omitted if desired.

A mask 23 is then applied on the surface of polysilicon layer 20 in the same manner as described above, resulting in a controlled pattern of photoresist 23a and 23b as shown in FIG. 4. A N type implant is then introduced into the exposed areas of polysilicon layer 16. A N+ poly material 24 and 26 is formed at the exposed locations. See FIG. 6. The N+ poly material has a final sheet resistance of 100Ω/square.

Figure 6:
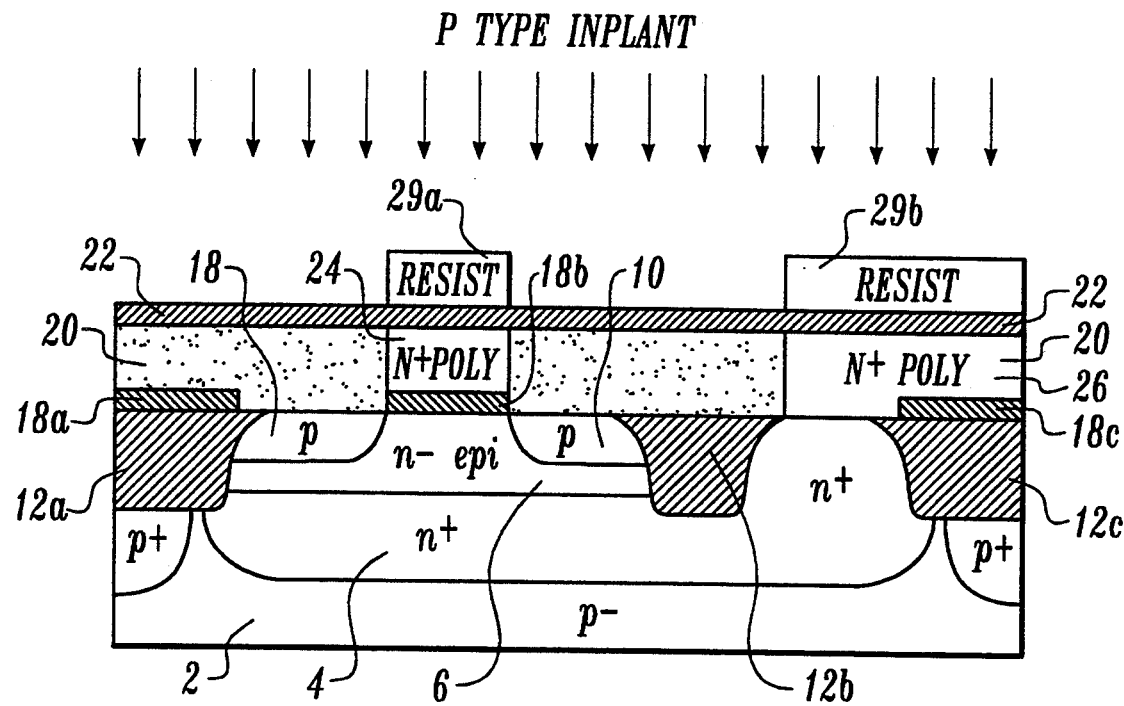
FIG. 6 is a cross-sectional view of a semiconductor substrate to which a second implantation mask has been applied according to an embodiment of the present invention.
Figure 7:
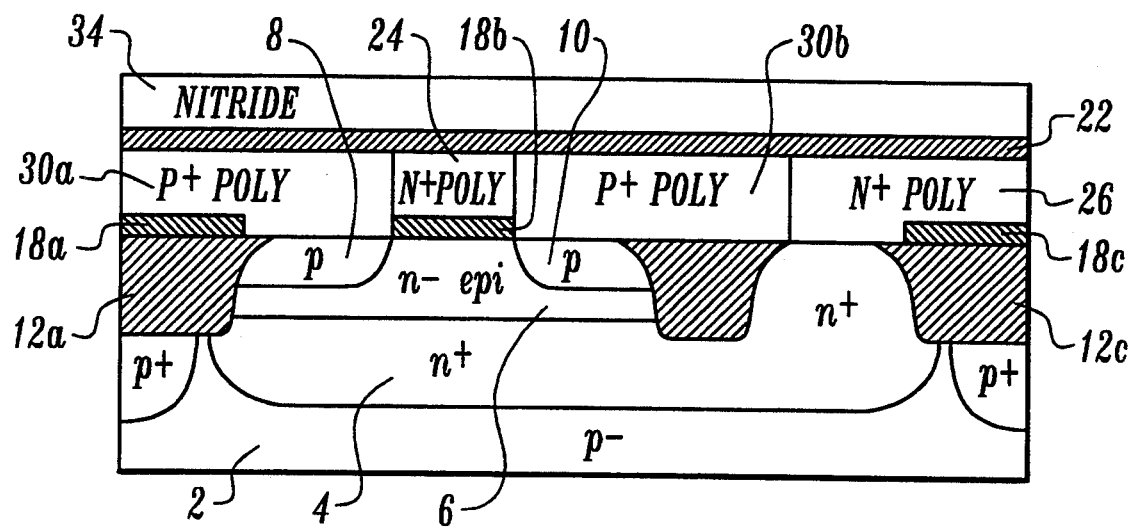
FIG. 7 is a cross-sectional view of a semiconductor substrate to which a layer of silicon nitride has been deposited over the doped polysilicon layer according to an embodiment of the present invention.
Figure 8:
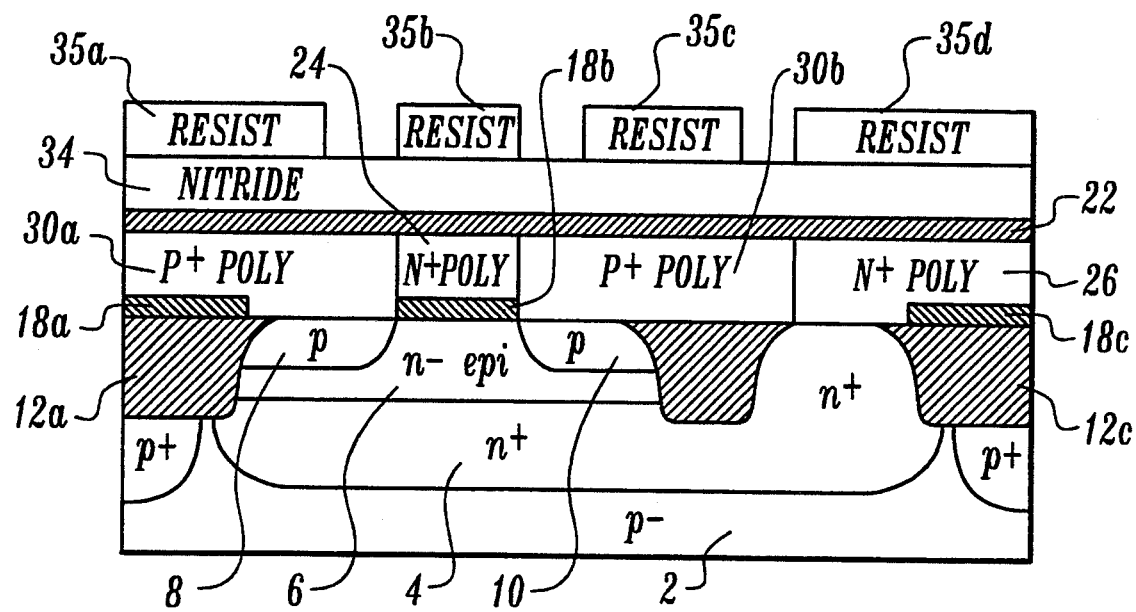
FIG. 8 is a cross-sectional view of a semiconductor substrate to which an oxidation mask is applied over the nitride layer according to an embodiment of the present invention.

In FIG. 6, the mask process is again repeated to form photoresist areas 29a and 29b. A P type implant is then applied to create P+ poly regions 30a and 30b in those areas not covered by resist. See FIG. 7.

Oxide layer 22 remains after creation of P+ poly regions 30 and N+ poly regions 24 and 26. Atop oxide layer 22, a silicon nitride layer 34 is deposited to provide an oxidation mask. See FIG. 7. In the preferred embodiment, nitride layer 34 is deposited using chemical vapor deposition to a thickness of 1100 Å.

Next, the structure is annealed to remove lattice damage caused by implanting the dopants and allowing the crystalline lattice to become electrically active. The durations and temperature of the anneal process depends upon the desired characteristics of the resulting transistor. In this embodiment, a temperature of 920° C. for a period of 30 minutes proves satisfactory.

Figure 9:
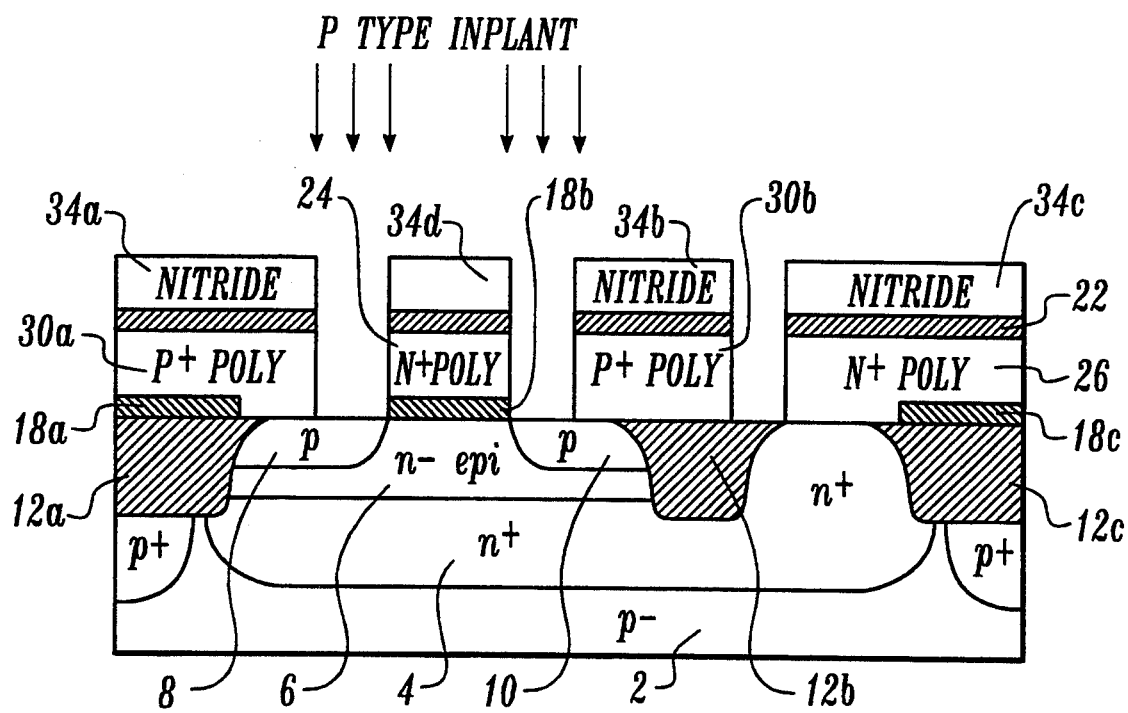
FIG. 9 is a cross-sectional view of a semiconductor substrate to which was etched to expose areas for P type dopant implantation according to an embodiment of the present invention.

The structure is then masked using well known photolithographic techniques as described above to prevent etching of the areas contained under 35a, b, c and d. The exposed nitride is then dry etched using fluorinated plasma, followed by etch of exposed portions of oxide layer 17 and polysilicon layer 16c and 16d to form the structure shown in FIG. 9.

An additional implant of P type material is then made to form regions 8a and 10a. See FIGS. 9 and 10. These heavily doped P+ regions have a concentration density of $2 \times 10^{18}$ atoms/cm$^3$ and serve to form the collector and emitter. The P+ poly regions have a final sheet resistance density of 280Ω/square.

Figure 10:
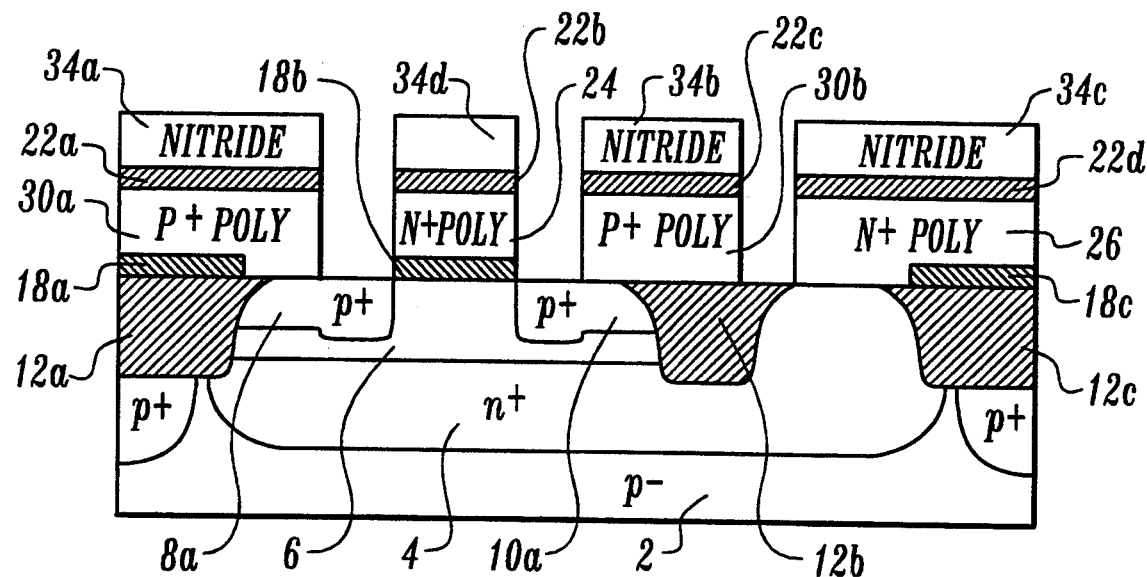
FIG. 10 is a cross-sectional view of a semiconductor substrate after implantation of the P type material according to an embodiment of the present invention.
Figure 11:
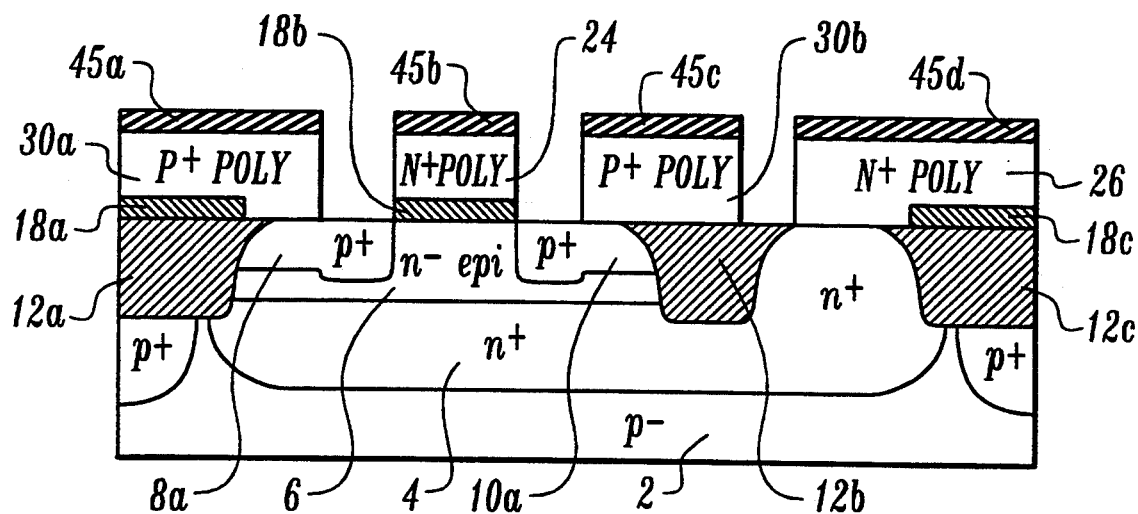
FIG. 11 is a cross-sectional view of a lateral pnp transistor completed according to an embodiment of the present invention.

The resulting structure is as shown in FIG. 10. Processing of the structure to complete formation of the contact areas of the bipolar transistor continues according to methods well known in the art. These methods deposit a layer of refractory metal 45, such as titanium to form global and local interconnects. When processing is finished as shown in FIG. 11, region 8a forms the collector of the transistor and region 10a forms the emitter of the transistor. P+ poly region 30a serves as the collector contact and P+ poly region 30b serves as the emitter contact. N− epi region 6 serves as the transistor base. N+ poly region 26 is the base contact.

In the completed bipolar transistor shown in FIG. 11, N− epi base 6 is now separated from N+ poly region 24 by oxide layer 18b. Oxide layer 18b prevents diffusion of the arsenic dopant into N− epi region 6 from N+ poly region 24. The base region of the transistor thus remains N− epi. This feature of the present invention results in a transistor with breakdown voltages greater than conventional transistors fabricated such that the N+ poly is in contact with the N− epi base.

Figure 12:
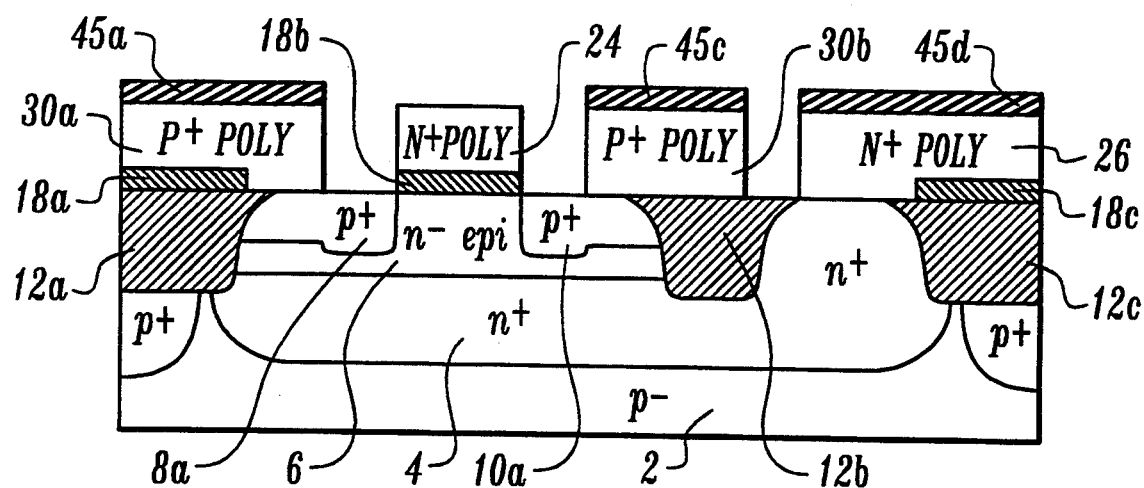
FIG. 12 is a cross-sectional view of a lateral pnp transistor with three metal regions.

FIG. 12 illustrates an alternative embodiment, showing a transistor with a metal layers covering three poly regions, the contacts for the emitter, collector, and base of the transistor. A metal layer covering poly region 24 is not necessary here, since the base contact is made using poly region 26.

In the present invention, phosphorus is used as the N type dopant. According to an embodiment of the present invention, an oxide layer thickness of approximately 350 Å halts diffusion of this dopant from the polysilicon layer required to the N− epitaxial base. Use of other dopants is possible by adjusting the thickness of oxide layer 18b.

The resulting improvement in breakdown voltages obtained by the present invention is tabulated in FIG. 13 together with the performance of other lateral pnp devices. As may be seen from the table, the use of undoped polysilicon also improves breakdown voltage characteristics. In addition, the use of an N+base contact not containing silicide also provides a transistor acceptable for use in ECL circuits. However, the current gain properties of these two devices, as tabulated in column three, do not compare favorably with the current gain properties of the device of the present invention. The device and manufacturing process of the present invention thus yields a circuit having both improved breakdown voltage characteristics for use in programmable array logic circuits and the speed advantages of devices incorporating doped polysilicon material.

The aforementioned advantages of the present invention may be had with minimal deviation from other core processes used to fabricate similar devices. The steps depicted in FIGS. 2 and 3 leading to the formation of oxide layer 18b are the only additional steps required. Thus, this module of steps can be inserted into the core process and the resulting benefits of the present invention can be had at a marginal cost.

It should also be readily apparent to those skilled in the art that the process of the present invention can also be used to create a PMOS device using a bipolar process. In the structure of FIG. 11, Area 8a is the source and area 10a forms the drain of the PMOS device while region 6 acts as a substrate. Region 50 serves as the source contact, region 52 as the gate contact and region 54 as the drain contact of the resulting PMOS transistor. Thus, the present invention permits PMOS transistors to be fabricated with minimal deviation from the core process used to form the improved bipolar transistor, providing further cost and efficiency advantages to semiconductor manufacturers.

The preferred embodiments of the present invention have now been described. Other variations will now be readily apparent to those skilled in the art. For this reason, the invention should be construed in light of the claims.

What is claimed is:

1. A contact structure for a lateral pnp semiconductor device having a base of a n conductivity type formed in a substrate, an emitter and a collector formed in said substrate, having on a surface of the substrate an exposed area of the base, comprising:
   a first doped polysilicon layer of said n conductivity type on the surface of said substrate above said exposed area; and
   an oxide layer disposed between said exposed area and said first doped polysilicon layer whereby impurities contained in said doped layer are prevented from diffusing into the base across the exposed area.

2. The invention of claim 1 wherein said contact structure further comprises:
   a layer of refractory metal deposited over said first doped polysilicon layer.

3. A semiconductor device on an integrated circuit substrate comprising:
   a collector of a first conductivity type;
   an emitter of said first conductivity type;
   a base of a second conductivity type disposed between said collector and said emitter and having an exposed base area along a surface of said substrate;
   a buried layer, of a second conductivity type wherein selected portions of said buried layer contact said base and wherein a portion of said buried layer contacts the surface of said substrate;
   an isolation region wherein said base, said buried layer, said emitter and said collector are isolated at least from other regions of said substrate;
   a first polysilicon region in contact with said buried layer where said buried layer contacts the surface of said substrate and wherein a base contact is formed;
   a second polysilicon region on the surface of said substrate which contacts said emitter and wherein an emitter contact is formed;
   a third polysilicon region on the surface of said substrate which contacts said collector and wherein a collector contact is formed;
   a fourth doped polysilicon region opposite the portion of said base which contacts the exposed base area and wherein an interconnect is formed; and
   a first oxide layer disposed between said fourth polysilicon layer and said surface of said substrate along the exposed base area whereby impurities contained in said fourth polysilicon layer are prevented from diffusing into the base across the exposed base area.

4. The invention of claim 3 wherein:
   the first conductivity type is a P type material; and
   the second conductivity type is an N type material.

5. The invention of claim 4 wherein:
   said first polysilicon region and fourth doped polysilicon region contain N type dopants; and
   said second polysilicon region and third polysilicon region contain P type dopants.

6. The invention of claim 3 further comprising:
   a layer of refractory metal on top of all of said first, second, third and fourth polysilicon regions.

7. The invention of claim 3 further comprising:
   a layer of refractory metal on top of at least one of said first, second, third and fourth polysilicon regions.

* * * * *